(12) United States Patent
Yamamura

(10) Patent No.: US 9,324,649 B2
(45) Date of Patent: Apr. 26, 2016

(54) SEMICONDUCTOR DEVICE INCLUDING A CAP SUBSTRATE ON A SIDE WALL THAT IS DISPOSED ON A SEMICONDUCTOR SUBSTRATE

(71) Applicant: Kabushiki Kaisha Toshiba, Minato-ku (JP)

(72) Inventor: Takuji Yamamura, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/310,380

(22) Filed: Jun. 20, 2014

(65) Prior Publication Data

US 2015/0076701 A1 Mar. 19, 2015

(30) Foreign Application Priority Data

Sep. 13, 2013 (JP) ................. 2013-190749

(51) Int. Cl.
*H01L 23/498* (2006.01)
*H01L 23/31* (2006.01)
(Continued)

(52) U.S. Cl.
CPC ........ *H01L 23/49838* (2013.01); *H01L 23/315* (2013.01); *H01L 23/3107* (2013.01); *H01L 23/3114* (2013.01); *H01L 23/3121* (2013.01);
(Continued)

(58) Field of Classification Search
CPC ............ H01L 23/4824; H01L 23/3121; H01L 23/552315; H01L 23/3114; H01L 23/3107; H01L 23/552; H01L 23/49838; H01L 23/3128; H01L 23/3135; H01L 23/315
See application file for complete search history.

(56) References Cited

U.S. PATENT DOCUMENTS 7,728,389 B2 6/2010 Yamamura
7,977,166 B2 7/2011 Yamamura
(Continued)

FOREIGN PATENT DOCUMENTS

EP 2 107 603 A1 10/2009
EP 2 187 435 A1 5/2010
(Continued)

OTHER PUBLICATIONS

European Search Report issued Apr. 9, 2015 in European Application No. 14174588.5 (6 pages)
(Continued)

*Primary Examiner* — Ermias Woldegeorgis
(74) *Attorney, Agent, or Firm* — Oblon, McClelland, Maier & Neustadt, L.L.P.

(57) ABSTRACT

Certain embodiments provide a semiconductor device including a semiconductor substrate, a side wall portion, a cap substrate, a plurality of external connection terminals, and a ground conductor. The semiconductor substrate includes a semiconductor element on its front surface. The side wall portion has conductivity and is provided on the front surface of the semiconductor substrate so as to surround the semiconductor element. The cap substrate is provided on the side wall portion so as to be electrically connected to the side wall portion. Each of the plurality of external connection terminals is provided on a back surface of the semiconductor substrate so as to be electrically connected to the semiconductor element. The ground conductor is provided to be electrically connected to the side wall portion on the entire back surface of the semiconductor substrate except an area in which the plurality of external connection terminals is provided.

20 Claims, 3 Drawing Sheets

(51) Int. Cl.
*H01L 23/482* (2006.01)
*H01L 23/552* (2006.01)

(52) U.S. Cl.
CPC ........ *H01L 23/3128* (2013.01); *H01L 23/3135* (2013.01); *H01L 23/4824* (2013.01); *H01L 23/552* (2013.01); *H01L 2224/06* (2013.01); *H01L 2924/0002* (2013.01)

(56) References Cited

U.S. PATENT DOCUMENTS

| | | | |
|---|---|---|---|
| 8,314,485 B2 | 11/2012 | Ono et al. | |
| 2002/0113306 A1* | 8/2002 | Kwon | H01L 23/49838 257/691 |
| 2002/0180005 A1* | 12/2002 | Haematsu | H01L 21/768 257/621 |
| 2007/0273008 A1* | 11/2007 | Suzuki | H01L 23/04 257/659 |
| 2009/0242947 A1 | 10/2009 | Yamamura | |
| 2010/0013064 A1* | 1/2010 | Hsu | H01L 23/055 257/660 |
| 2010/0167473 A1 | 7/2010 | Yamamura | |
| 2010/0200983 A1 | 8/2010 | Ono et al. | |
| 2010/0207258 A1* | 8/2010 | Eun | H01L 23/055 257/660 |

FOREIGN PATENT DOCUMENTS

| | | |
|---|---|---|
| JP | 2002-9193 | 1/2002 |
| JP | 2005-057136 A | 3/2005 |
| JP | 2010-087926 A | 4/2010 |
| JP | 2010-226057 | 10/2010 |
| JP | 2012-084669 A | 4/2012 |
| JP | 5193750 | 5/2013 |

OTHER PUBLICATIONS

Office Action issued Jan. 19, 2016 in Japanese Patent Application No. 2013-190749.
Office Action issued Feb. 8, 2016 in European Patent Application No. 14174855.5.

* cited by examiner

US 9,324,649 B2

SEMICONDUCTOR DEVICE INCLUDING A CAP SUBSTRATE ON A SIDE WALL THAT IS DISPOSED ON A SEMICONDUCTOR SUBSTRATE

CROSS REFERENCE TO RELATED APPLICATIONS

This application is based upon and claims the benefit of priority from the prior Japanese Patent Application No. 2013-190749 filed in Japan on Sep. 13, 2013; the entire contents of which are incorporated herein by reference.

FIELD

Embodiments described herein relate generally to a semiconductor device.

BACKGROUND

As a conventional semiconductor device, a chip scale package (CSP)-type semiconductor device is known. This semiconductor device is manufactured as follows. First, a plurality of semiconductor chips is formed on a semiconductor wafer, and these semiconductor chips are sealed with a resin, or the like. This enables a plurality of semiconductor devices to be integrally formed on the semiconductor wafer. Next, the plurality of semiconductor devices is divided into individual pieces. Accordingly, the CSP-type semiconductor devices are manufactured. The CSP-type semiconductor device manufactured in this way is manufactured at low cost because a plurality of semiconductor devices is integrally packaged in the wafer process.

In this semiconductor device, external connection terminals are provided on a back surface of the device with solder balls, for example. The semiconductor device is flip-chip mounted on a mounting board through the external connection terminals.

Conventionally, this semiconductor device radiates heat generated from the semiconductor device to the mounting board through the external connection terminals. However, in recent years, semiconductor chips capable of high output at a high-frequency band, such as a field effect transistor, using a GaN-based material have been developed. In a CSP-type semiconductor device that incorporates such a high-output semiconductor chip, there is a problem that the quantity of generated heat is increased, and the semiconductor device cannot be sufficiently cooled by a conventional heat radiation method.

To solve the problem, a technique to provide a heat sink on an upper surface of the semiconductor chip can be considered, for example. However, one of advantages of the CSP-type semiconductor device is low cost of device. Therefore, if the heat sink is provided, the cost is increased, and the advantage of the CSP-type semiconductor device is impeded.

Further, the conventional CSP-type semiconductor device has a structure that simply seals the semiconductor chip with a resin, and thus does not have electromagnetic shield. However, with high frequencies of signals used for the incorporated semiconductor chip, providing of the electromagnetic shield has been demanded in order to separate the semiconductor chip from outside.

DESCRIPTION OF THE EMBODIMENTS

Certain embodiments provide a semiconductor device including a semiconductor substrate, a side wall portion, a cap substrate, a plurality of external connection terminals, and a ground conductor. The semiconductor substrate includes a semiconductor element on its front surface. The side wall portion is provided on the front surface of the semiconductor substrate so as to surround the semiconductor element in a frame like manner. The side wall portion has conductivity. The cap substrate is provided on the side wall portion so as to be electrically connected to the side wall portion. Each of the plurality of external connection terminals is provided on a back surface of the semiconductor substrate so as to be electrically connected to the semiconductor element. The ground conductor is provided on the entire back surface of the semiconductor substrate except an area in which the plurality of external connection terminals is provided. The ground conductor is electrically connected to the side wall portion.

Hereinafter, a semiconductor device according to embodiments will be described in detail with reference to the drawings.

Figure 1:
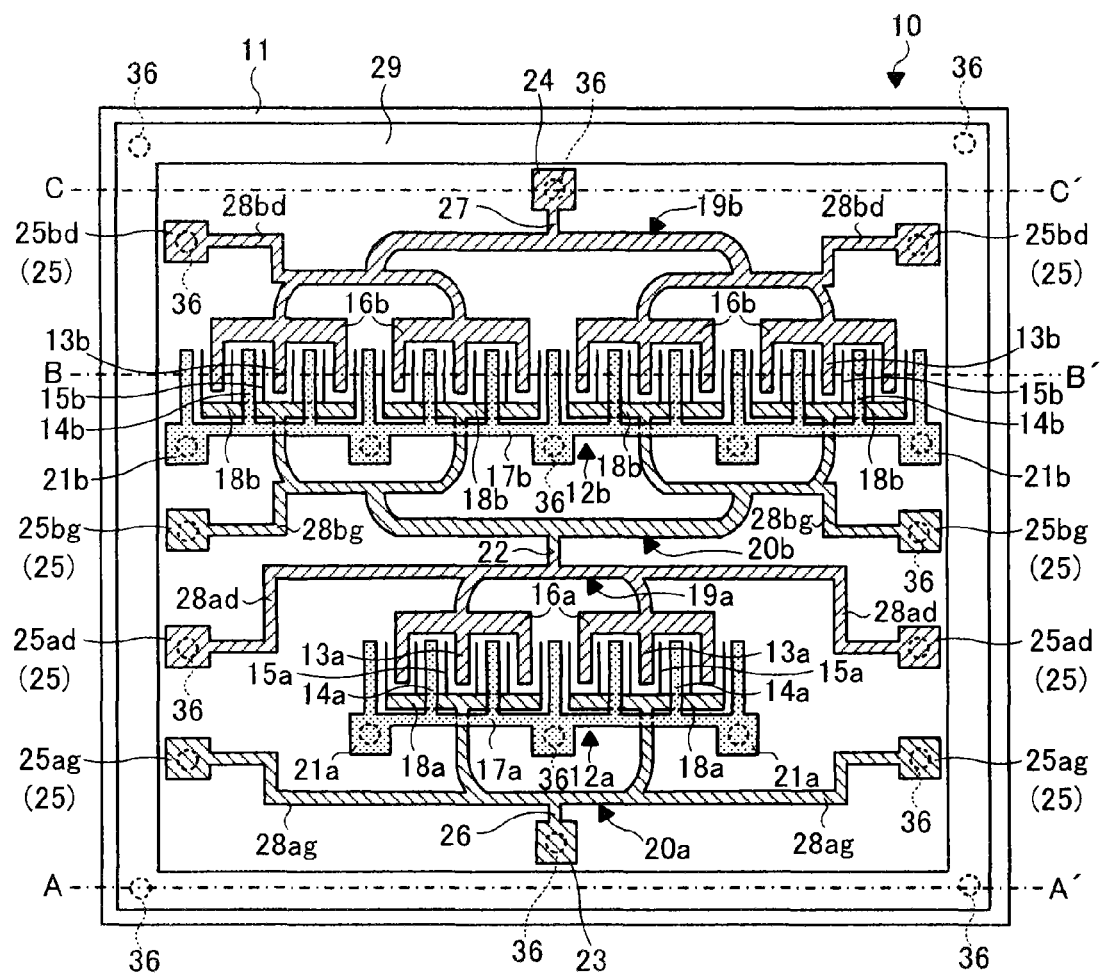
FIG. 1 is a plan view schematically illustrating a semiconductor device according to an embodiment.

FIG. 1 is a plan view schematically illustrating a semiconductor device according to the present embodiment. As illustrated in FIG. 1, in a semiconductor device 10 according to an embodiment, a plurality of semiconductor elements is provided on a front surface of a semiconductor substrate 11. The semiconductor substrate 11 is made of any of silicon, GaAs, and GaN, for example, and is a square substrate with one side of about 5 mm.

Each of the plurality of semiconductor elements is a field effect transistor (hereinafter, referred to as FET), for example. In the semiconductor device 10 according to the present embodiment, two FETs made of an input-side FET 12a and an output-side FET 12b are provided.

The input-side FET 12a has a plurality of FETs each of which includes a finger-like drain electrode 13a, a finger-like source electrode 14a, and a finger-like gate electrode 15a. The plurality of finger-like drain electrodes 13a are arranged in parallel to each other, and are electrically connected with each other by a drain electrode connection portion 16a. Similarly, the plurality of finger-like source electrodes 14a are arranged in parallel to each other, and are electrically connected with each other by source electrode connection portions 17a. The plurality of finger-like gate electrodes 15a are arranged in parallel to each other, and are electrically connected with each other by a gate electrode connection portion 18a. The input-side FET 12a is configured by the parallel connection of the plurality of FETs in this way.

The drain electrode connection portion 16a and the gate electrode connection portion 18a are respectively divided into a plurality of (for example, two) portions to suppress high frequency oscillation. The plurality of divided drain electrode connection portions 16a are electrically connected by a U-shaped combining circuit 19a, and the plurality of gate electrode connection portions 18a are electrically connected by a U-shaped branch circuit 20a. Note that, in the non-divided source electrode connection portion 17a, a plurality of (for example, three) source electrode pads 21*a* are provided at approximately equal intervals.

Similarly, the output-side FET 12*b* has a plurality of FETs each of which includes a finger-like drain electrode 13*b*, a finger-like source electrode 14*b*, and a finger-like gate electrode 15*b*. The plurality of finger-like drain electrodes 13*b* are arranged in parallel to each other, and are electrically connected with each other by a drain electrode connection portion 16*b*. Similarly, the plurality of finger-like source electrodes 14*b* are arranged in parallel to each other, and are electrically connected with each other by a source electrode connection portion 17*b*. The plurality of finger-like gate electrodes 15*b* are arranged in parallel to each other, and are electrically connected with each other by a gate electrode connection portion 18*b*. The output-side FET 12*b* is configured by the parallel connection of the plurality of FETs in this way.

The drain electrode connection portion 16*b* and the gate electrode connection portion 18*b* are respectively divided into a plurality of (for example, four) portions. The plurality of divided drain electrode connection portions 16*b* are electrically connected by a combining circuit 19*b* which is formed by combining U-shaped high-frequency lines, and the plurality of divided gate electrode connection portions 18*b* is electrically connected by a branch circuit 20*b* which is formed by combining U-shaped high-frequency lines. Note that, in the non-divided source electrode connection portion 17*b*, a plurality of (for example, five) source electrode pads 21*b* are provided at approximately equal intervals.

The combining circuit 19*a* of the input-side FET 12*a* and the branch circuit 20*b* of the output-side FET 12*b* are electrically connected by an FET connection high-frequency line 22, so that the input-side FET 12*a* and the output-side FET 12*b* are connected in series.

Further, on the front surface of the semiconductor substrate 11, a plurality of electrode pads is provided in a peripheral region of an element region where the input-side FET 12*a*, the output-side FET 12*b*, and the like are provided. Each of the plurality of electrode pads is one of an input-side electrode pad 23 for inputting a high-frequency signal to the input-side FET 12*a*, an output-side electrode pad 24 into which a high-frequency signal output from the output-side FET 12*b* is input, and a plurality of bias electrode pads 25 for supplying a bias voltage as a driving voltage to each of the plurality of FETs.

The input-side electrode pad 23 and the output-side electrode pad 24 are provided in the peripheral region on the front surface of the semiconductor substrate 11 such that these pads 23 and 24 sandwich the plurality of FETs 12*a* and 12*b*. The input-side electrode pad 23 is electrically connected with the branch circuit 20*a* of the input-side FET 12*a* by an input-side high-frequency line 26, and the output-side electrode pad 24 is electrically connected with the combining circuit 19*b* of the output-side FET 12*b* by an output-side high-frequency line 27.

The plurality of bias electrode pads 25 is made of an input-side FET gate bias electrode pad 25*ag*, an input-side FET drain bias electrode pad 25*ad*, an output-side FET gate bias electrode pad 25*bg*, and an output-side FET drain bias electrode pad 25*bd*.

A plurality of (for example, two) input-side FET gate bias electrode pads 25*ag* are provided at both sides of the input-side FET 12*a* in the peripheral region of the front surface of the semiconductor substrate 11, and a plurality of (for example, two) input-side FET drain bias electrode pads 25*ad* are provided at both sides of the input-side FET 12*a* in the peripheral region of the front surface of the semiconductor substrate 11. Each of the plurality of input-side FET gate bias electrode pads 25*ag* is electrically connected with the branch circuit 20*a* of the input-side FET 12*a* by a bias supply line 28*ag*, and each of the plurality of input-side FET drain bias electrode pads 25*ad* is electrically connected with the combining circuit 19*a* of the input-side FET 12*a* by a bias supply line 28*ad*.

Similarly, a plurality of (for example, two) output-side FET gate bias electrode pads 25*bg* are provided at both sides of the output-side FET 12*b* in the peripheral region of the semiconductor substrate surface 11, and a plurality of (for example, two) output-side FET drain bias electrode pads 25*bd* are provided at both sides of the output-side FET 12*b* in the peripheral region of the front surface of the semiconductor substrate 11. Each of the plurality of output-side FET gate bias electrode pads 25*bg* is electrically connected with the branch circuit 20*b* of the output-side FET 12*b* by a bias supply line 28*bg*, and each of the plurality of output-side FET drain bias electrode pads 25*bd* is electrically connected with the combining circuit 19*b* of the output-side FET 12*b* by a bias supply line 28*bd*.

Note that the input-side FET gate bias electrode pad 25*ag*, the input-side FET drain bias electrode pad 25*ad*, the output-side FET gate bias electrode pad 25*bg*, and the output-side FET drain bias electrode pad 25*bd* provided at one end portion side of the plurality of FETs 12*a* and 12*b* (for example, the left side of the drawing) are arranged substantially in a line manner in this order from the input side to the output side of the device 10. At the other end portion side of the plurality of FETs 12*a* and 12*b* (for example, on the right side of the drawing), the plurality of bias electrode pads 25 are provided in the same way.

As described above, on the front surface of the semiconductor substrate 11 on which the plurality of FETs 12*a* and 12*b* and the various electrode pads 23, 24, and 25 are provided, the square and frame-like side wall portion 29 that surrounds the plurality of FETs and the various electrode pads along an outer periphery of the semiconductor substrate 11 is provided.

The side wall portion 29 is a frame-like metal body having a width of about 100 μm, for example. However, the material that configures the side wall portion 29 is not limited to a metal, and any material may be employed as long as the material has conductivity (conductor). The side wall portion 29 can be formed such that a predetermined metal, such as Cu, Al, or Au, is formed on the front surface of the semiconductor substrate 11 by a normal semiconductor process technology (for example, plating). However, the method of forming the side wall portion 29 is not limited to the semiconductor process technology, such as a plating method, and the side wall portion may be provided such that a metal body is processed into a frame shape, and the frame-like metal body is fixed on the front surface of the semiconductor substrate 11. Note that, if the side wall portion 29 is formed using a normal semiconductor process technology, the side wall portion 29 can be formed together with manufacturing of the semiconductor elements such as the FETs 12*a* and 12*b*. Therefore, it is favorable to form the side wall portion 29 by the normal semiconductor process technology.

Figure 2:
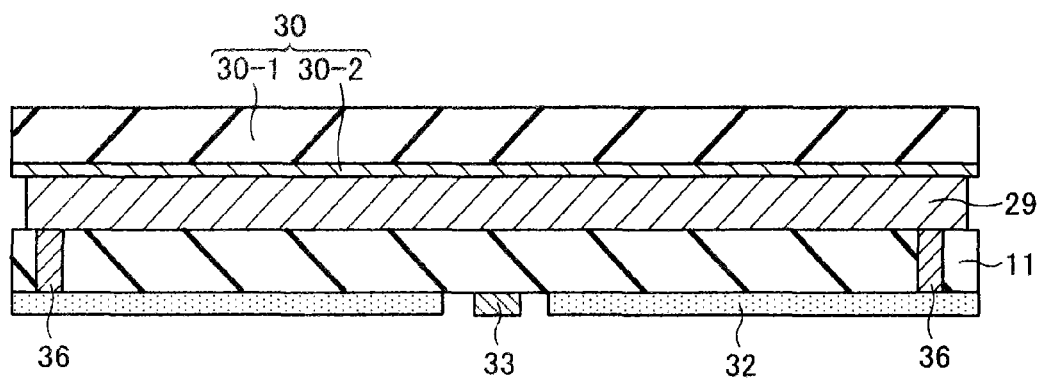
FIG. 2 is a cross-sectional view of the semiconductor device along the dashed line A-A' of FIG. 1.
Figure 3:
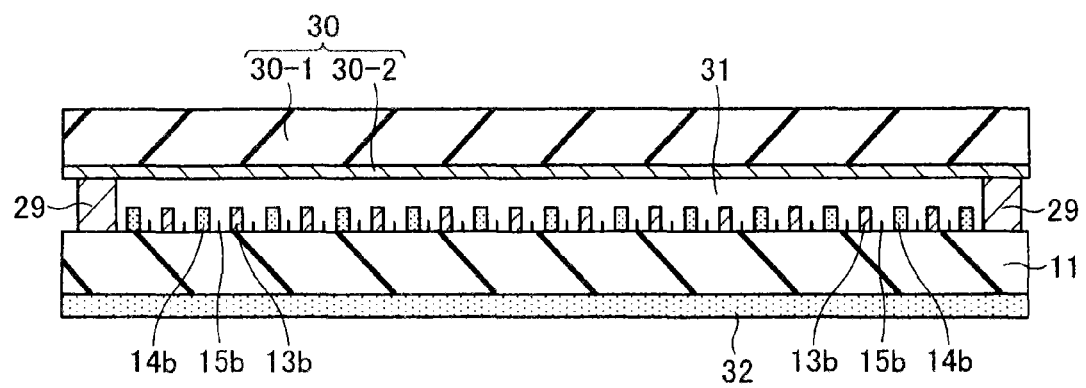
FIG. 3 is a cross-sectional view of the semiconductor device along with the dashed line B-B' of FIG. 1.

FIG. 2 is a cross-sectional view of a semiconductor device along the dashed line A-A' of FIG. 1. FIG. 3 is a cross-sectional view of the semiconductor device along the dashed line B-B' of FIG. 1, and FIG. 4 is a cross-sectional view of the semiconductor device along the dashed line C-C' of FIG. 1.

Figure 4:
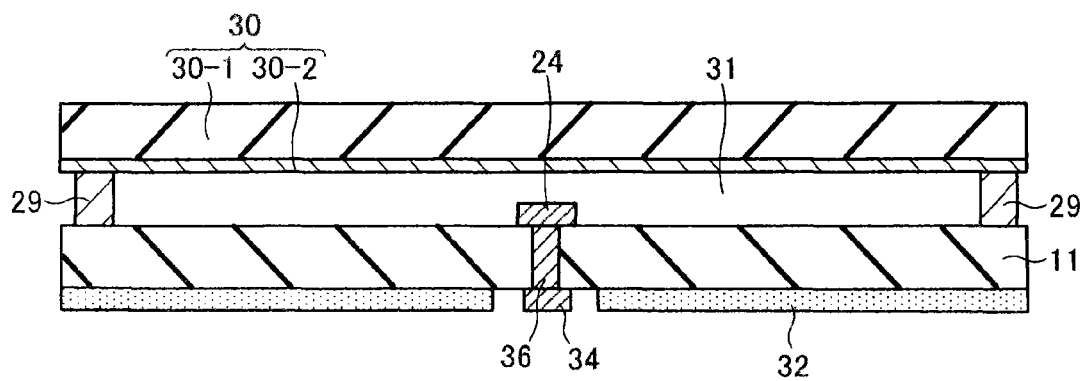
FIG. 4 is a cross-sectional view of the semiconductor device along with the dashed line C-C' of FIG. 1.

As illustrated in FIGS. 2 to 4, the cap substrate 30 is provided on the frame-like side wall portion 29. The cap substrate 30 is formed such that a conductive film 30-2, such as a metal, is formed on a back surface of a semiconductor substrate, or an inorganic substrate 30-1 such as a glass substrate or a ceramic substrate. The cap substrate 30 is fixed on the side wall portion 29 such that the conductive film 30-2 is electrically connected to the side wall portion 29 through an adhesive agent (not illustrated) having conductivity, such as solder, or a conductive adhesive.

The configuration of the cap substrate 30 is not limited to the above-described configuration, and any substrate may be employed as long as the substrate has conductivity so as to be electrically connected to the side wall portion 29. Therefore, the cap substrate 30 may be a metal plate, for example. Further, in the embodiment, the cap substrate 30 is fixed to the side wall portion 29 by an adhesive agent (not illustrated). However, the cap substrate 30 may be fixed to the side wall portion 29 by thermo compression bonding.

Note that, as illustrated iri FIGS. 3 and 4, the side wall portion 29 is formed to be thicker than at least the thickness of the various electrodes 13a, 13b, 14a, 14b, 15a, and 15b of the plurality of FETs 12a and 12b, and the thickness of the electrode pads 23, 24, and 25. Then, the cap substrate 30 is provided on such a side wall portion 29. By providing the side wall portion 29 and the cap substrate 30 in this way, a hollow portion 31 that hermetically seals the plurality of FETs 12a and 12b and the plurality of electrode pads 23, 24, and 25 is formed.

By hermetically sealing the plurality of FETs 12a and 12b and the plurality of electrode pads 23, 24, and 25, moisture resistance of the semiconductor device 10 is improved, and attaching of unnecessary objects, such as a metal generating by the process of manufacturing the semiconductor device 10, to the FETs 12a and 12b can be suppressed. As a result, reliability of the semiconductor device 10 can be improved.

Further, the hollow portion 31 is provided. Therefore, the parasitic capacitance occurring between each of the plurality of FETs 12a and 12b and the plurality of electrode pads 23, 24, and 25, and the side wall portion 29 or the cap substrate 30 is decreased, compared with a case in which the hollow portion. 31 is filled with a dielectric, such as a resin. As a result, characteristics of the FETs 12a and 12b, such as a gain, can be improved.

Figure 5:
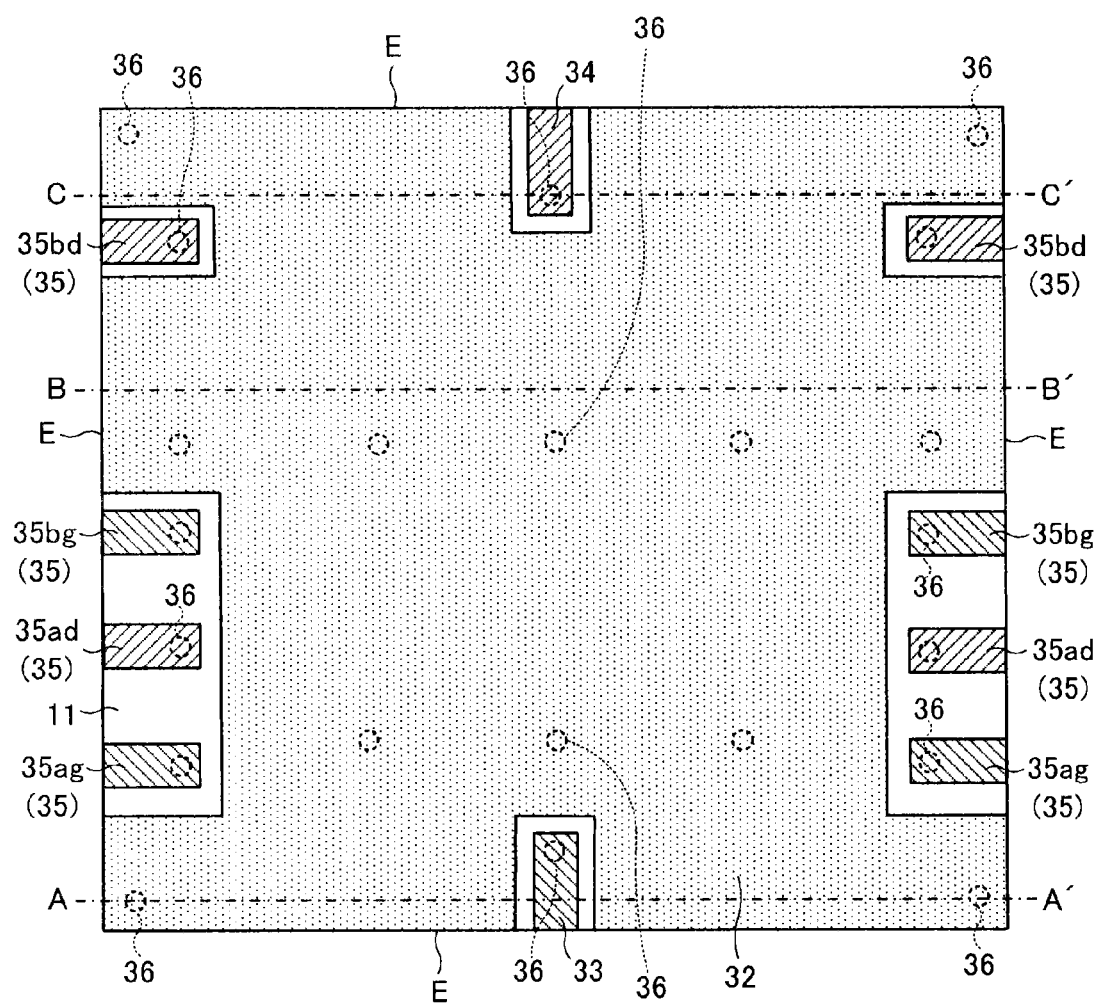
FIG. 5 is a plan view of the semiconductor device of FIG. 1 as viewed from a back surface side.

FIG. 5 is a plane view of the semiconductor device 10 illustrated in FIG. 1 as viewed from a back surface side of the semiconductor substrate 11. As illustrated in FIG. 5, a plurality of terminal portions that is a plurality of external connection terminals and a ground conductor 32 are provided on the back surface of the semiconductor substrate 11.

Each of the various terminal portions is any of an input terminal portion 33 for inputting a high-frequency signal to the semiconductor device 10, an output terminal portion 34 for outputting a high-frequency signal from the semiconductor device to an outside, and a plurality of bias supply terminal portions 35 for supplying a bias voltage to each of the plurality of FETs 12a and 12b. One end of each of the terminal portions is in contact with an edge E on the back surface of the semiconductor substrate 11, and these terminal portions are provided such that these portions are extended from the contact positions toward the inside of the semiconductor substrate 11.

The input terminal portion 33 and the output terminal portion 34 are respectively provided on the back surface of the semiconductor substrate 11 at positions corresponding to the input-side electrode pad 23 and the output-side electrode pad 24 (FIG. 1) provided on the front surface of the semiconductor substrate 11. Then, as illustrated in FIG. 4, the output terminal portion 34 and the output-side electrode pad 24 are electrically connected by a through electrode 36 that penetrates the semiconductor substrate 11. Similarly, the input terminal portion 33 and the input-side electrode pad 23 are electrically connected by a through electrode that penetrates the semiconductor substrate 11 (FIGS. 1 and 5).

The plurality of bias supply terminal portions is made of an input-side FET gate bias supply terminal portion 35a g, an input-side FET drain bias supply terminal portion 35ad, an output-side FET gate bias supply terminal portion 35bg, and an output-side FET drain bias supply terminal portion 35bd. The plurality of bias supply terminal portions 35 are respectively provided on the back surface of the semiconductor substrate 11 at positions corresponding to the plurality of bias electrode pads (FIG. 1) provided on the front surface of the semiconductor substrate 11. Then, the mutually corresponding bias supply terminal portion 35 and bias electrode pad 25 are electrically connected by the through electrodes 36 that penetrate the semiconductor substrate 11 (FIGS. 1 and 5).

Further, the ground conductor 32 is provided on the entire back surface of the semiconductor substrate 11 except the region where the plurality of terminal portions 33, 34, and 35 is provided. Here, in the present application, the region where the terminal portions 33, 34, and 35 are provided means a portion where the terminal portions 33, 34, and 35 are provided and its peripheral portion (a region necessary for the terminal portions 33, 34, and 35 and the ground conductor 32 to be isolated) on the back surface of the semiconductor substrate 11.

Then, as illustrated in FIG. 2, the ground conductor 32 and the side wall portion 29 provided on the front surface of the semiconductor substrate are electrically connected by the through electrodes 36 that penetrate the semiconductor substrate 11. Accordingly, the side wall portion 29 and the cap substrate 30 electrically connected to the side wall portion 29 are both grounded. Therefore, the plurality of FETs 12a and 12b, and the various electrode pads 23, 24, and 25 provided on the front surface of the semiconductor substrate 11 are surrounded by a ground potential.

Note that, similarly, both of the ground conductor 32 and the source electrode pads 21a and 21b are electrically connected by the through electrodes 36 (FIGS. 1 and 5) that penetrate the semiconductor substrate 11.

The semiconductor device 10 described above is a chip scale package (CSP)-type semiconductor device, and is formed such that a plurality of semiconductor devices 10 is integrally formed on a silicon wafer, and the plurality of semiconductor devices 10 is then individually divided by dicing.

According to the semiconductor device 10 of the described-above embodiment, the ground conductor 32 is provided on the entire back surface of the semiconductor substrate 11 where the various terminal portions 33, 34, and 35 are provided, except the region where the various terminal portions 33, 34, and 35 are provided. The ground conductor 32 forms a heat radiation path of heat generated in the plurality of FETs 12a and 12b. Therefore, in the semiconductor device 10 according to the embodiment, the heat generated inside the semiconductor substrate 11 is radiated from almost the entire back surface of the semiconductor substrate 11. As a result, the heat radiation can be improved without increasing the cost, compared with the conventional CSP-type semiconductor device flip-chip mounted on a mounting board through the external connection terminals, such as solder balls.

Further, according to the semiconductor device 10 of the embodiment, the plurality of FETs 12a and 12b, and the like are surrounded by the grounded side wall portion 29 and cap substrate 30. The grounded side wall portion 29 and cap substrate 30 form electromagnetic shield. Therefore, according to the semiconductor device 10 of the embodiment, the electromagnetic shield can be provided by the grounded side wall portion 29 and cap substrate 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate including a semiconductor element on a front surface;
   a side wall portion provide on the front surface of the semiconductor substrate so as to surround the semiconductor element in a frame like manner, the side wall portion having conductivity;
   a cap substrate provided on the side wall portion so as to be electrically connected to the side wall portion;
   a plurality of external connection terminals provided on a back surface of the semiconductor substrate so as to be electrically connected to the semiconductor element; and
   a ground conductor provided on an entire back surface of the semiconductor substrate except a region where the plurality of external connection terminals is provided, the ground conductor being provided so as to be electrically connected to the side wall portion.

2. The semiconductor device according to claim 1, wherein the ground conductor and the plurality of external connection terminals are separated so as to be mutually isolated.

3. The semiconductor device according to claim 1, wherein the semiconductor substrate, the side wall portion, and the cap substrate form a hollow portion that hermetically seals the semiconductor element.

4. The semiconductor device according to claim 1, wherein each of the plurality of external connection terminals includes one end that is in contact with an edge of the back surface of the semiconductor substrate, and is provided so as to extend on the back surface of the semiconductor substrate from the one end.

5. The semiconductor device according to claim 4, wherein the semiconductor element and the plurality of external connection portions are electrically connected through a plurality of through electrodes that penetrate the semiconductor substrate, and
   the side wall portion and the ground conductor are electrically connected by a through electrode that penetrates the semiconductor substrate.

6. The semiconductor device according to claim 5, wherein the semiconductor element is a field effect transistor.

7. The semiconductor device according to claim 6, wherein the plurality of external connection terminals are an input terminal portion that inputs a high-frequency signal to the field effect transistor, an output terminal portion to which the high-frequency signal is input from the field effect transistor, and a bias supply terminal portion that supplies a driving voltage to the field effect transistor.

8. The semiconductor device according to claim 1, wherein the side wall portion is a metal.

9. The semiconductor device according to claim 8, wherein the cap substrate includes an inorganic substrate and a conductive film provided on a back surface of the inorganic substrate, and
   the conductive film is electrically connected to the side wall portion.

10. The semiconductor device according to claim 8, wherein the cap substrate is a metal plate.

11. A semiconductor device comprising:
    a semiconductor substrate including a semiconductor element on a front surface, and having a plurality of electrode pads on the front surface, the plurality of electrode pads being electrically connected to the semiconductor element;
    a side wall portion provided on the front surface of the semiconductor substrate so as to surround the semiconductor element and the plurality of electrode pads in a frame like manner, the side wall portion having conductivity;
    a cap substrate provided on the side wall portion so as to be electrically connected to the side wall portion;
    a plurality of external connection terminals provided on a back surface of the semiconductor substrate so as to be electrically connected to the plurality of electrode pads; and
    a ground conductor provided on an entire back surface of the semiconductor substrate except a region where the plurality of external connection terminals is provided, the ground conductor being provided so as to be electrically connected to the side wall portion.

12. The semiconductor device according to claim 11, wherein the ground conductor and the plurality of external connection terminals are separated so as to be mutually isolated.

13. The semiconductor device according to claim 11, wherein the semiconductor substrate, the side wall portion, and the cap substrate form a hollow portion that hermetically seals the semiconductor element and the plurality of electrode pads.

14. The semiconductor device according to claim 11, wherein each of the plurality of external connection terminals includes one end that is in contact with an edge of the back surface of the semiconductor substrate, and is provided so as to extend on the back surface of the semiconductor substrate from the one end.

15. The semiconductor device according to claim 14, wherein the plurality of electrode pads and the plurality of external connection terminals are electrically connected by a plurality of through electrodes that penetrate the semiconductor substrate, and
    the side wall portion and the ground conductor are electrically connected by a through electrode that penetrates the semiconductor substrate.

16. The semiconductor device according to claim 15, wherein the semiconductor element is a field effect transistor.

17. The semiconductor device according to claim 16, wherein the plurality of electrode pads are an input-side electrode pad for inputting a high-frequency signal to the field effect transistor, an output side electrode pad to which the high-frequency signal output from the field effect transistor is input, and a bias electrode pad that supplies a bias voltage to the field effect transistor, and
    the plurality of external connection terminals are an input terminal portion which is electrically connected to the input-side electrode pad, an output terminal portion which is electrically connected to the output-side electrode pad, and a bias supply terminal portion which is electrically connected to the bias electrode pad.

18. The semiconductor device according to claim 11, wherein the side wall portion is a metal.

19. The semiconductor device according to claim 18, wherein the cap substrate includes an inorganic substrate and a conductive film provided on a back surface of the inorganic substrate, and the conductive film is electrically connected to the side wall portion.

20. The semiconductor device according to claim 18, wherein the cap substrate is a metal plate.

\* \* \* \* \*